US011214015B2

(12) United States Patent
Ballinger et al.

(10) Patent No.: US 11,214,015 B2
(45) Date of Patent: Jan. 4, 2022

(54) METHODS AND SYSTEMS FOR CONTROLLING TEMPERATURE ACROSS A REGION DEFINED BY USING THERMALLY CONDUCTIVE ELEMENTS

(71) Applicant: SelfArray, Inc., Troy, NY (US)

(72) Inventors: Clinton Ballinger, Burnt Hills, NY (US); Michael Conward, Troy, NY (US); Pei-I Wang, Clifton Park, NY (US)

(73) Assignee: SELFARRAY, INC., Troy, NY (US)

( * ) Notice: Subject to any disclaimer, the term of this patent is extended or adjusted under 35 U.S.C. 154(b) by 0 days.

(21) Appl. No.: 16/870,327

(22) Filed: May 8, 2020

(65) Prior Publication Data

US 2021/0053297 A1 Feb. 25, 2021

Related U.S. Application Data

(60) Provisional application No. 62/890,735, filed on Aug. 23, 2019.

(51) Int. Cl.
*B29C 65/74* (2006.01)
*B29C 65/16* (2006.01)
*H01L 21/67* (2006.01)

(52) U.S. Cl.
CPC ...... *B29C 65/7411* (2013.01); *B29C 65/1635* (2013.01); *B29C 65/1606* (2013.01); *H01L 21/67132* (2013.01)

(58) Field of Classification Search
CPC ............ B29C 65/1635; B29C 65/1606; H01L 21/6835
See application file for complete search history.

(56) References Cited

U.S. PATENT DOCUMENTS

| | | | |
|---|---|---|---|
| 5,637,169 A | 6/1997 | Hull et al. |
| 8,012,566 B2 | 9/2011 | Govinda et al. |
| 8,661,655 B2 | 3/2014 | Weekamp et al. |
| 9,862,141 B2 | 1/2018 | Marinov et al. |

(Continued)

FOREIGN PATENT DOCUMENTS

WO 2012142177 A2 10/2012

OTHER PUBLICATIONS

Young, Lee, Application No. PCT/US2020/47157, Search Report & Written Opinion, dated Nov. 19, 2020, 15 pgs.

*Primary Examiner* — Daniel McNally
(74) *Attorney, Agent, or Firm* — Hunter E. Webb; Keohane & D'Alessandro, PLLC

(57) ABSTRACT

An approach is provided for separating a selected component from a plurality of components in a multi-component medium. A multi-component medium is created, including thermally conductive layer into which a template of patterned thermally conductive elements that are thermally separated from each other, a thermally active adhesion layer in thermal communication with the thermally conductive template, and a set of components attached to the thermally active adhesion layer in substantially the same pattern as thermally conductive template. The medium allows a selected component to be released by applying energy to a selected thermally conductive element corresponding to the selected component, inducing a temperature differential reducing the adhesion of the thermally active adhesion layer, without releasing non-selected components.

7 Claims, 7 Drawing Sheets

(56) References Cited

U.S. PATENT DOCUMENTS

| | | | |
|---|---|---|---|
| 2006/0124241 A1* | 6/2006 | Doi | C09J 7/38 |
| | | | 156/710 |
| 2013/0228221 A1 | 9/2013 | Moslehi et al. | |
| 2018/0261570 A1 | 9/2018 | Durniak | |
| 2019/0015873 A1 | 1/2019 | Durniak | |

* cited by examiner

METHODS AND SYSTEMS FOR CONTROLLING TEMPERATURE ACROSS A REGION DEFINED BY USING THERMALLY CONDUCTIVE ELEMENTS

FIELD OF THE INVENTION

The present invention relates to methods and systems for controlling the surface temperature profile across a region by use of shaped thermally conductive elements arranged with spacing to define the boundaries of the temperature profile across a region.

BACKGROUND

In many manufacturing processes, precise geometric control over the temperature profile is important. Controlling the temperature profile on a micro-scale is very difficult across a surface but many manufacturing processes could benefit from precision geometric control. Convection, conduction, and radiative heat sources have their own unique issues when it comes to directing their energy toward a surface to be heated. All of these heat sources can be difficult to "shape" i.e. repeatedly result in a particular shaped temperature profile across a region. In the micro-electronics industry in particular, thermal releasable materials are used in transfer processing on a routine basis. For example, there is an entire class of additive manufacturing methods called laser induced forward transfer (LIFT) where a laser is used to transfer a component from a donor substrate to a receiving substrate. Typically, the laser is focused to supply a high energy density that propels the component from donor to receiver. The size and shape of the affected area using laser induced transfer is determined by the laser beam size. Typically, this means relatively small spot sizes that are used in the heating process.

The LIFT technologies that have been developed for over a decade have been used for organic, inorganic, and even biological, materials with success. As part of the process, dynamic release layer (DRL) may be incorporated into the system that allows for easier transfer from donor to receiver substrate by changes induced in the DRL. Typically, these DRL's are activated by UV or other wavelength laser light and since this is a photonic process, care must be taken to ensure that there is nothing impeding the optical laser signal along the path.

Other examples of temperature release processes in the electronics industry use a heat source in conjunction with thermal release tape, where a temperature rise alters the tapes adhesive strength and hence can be used in transferring components from donor to receiver substrate as well. Unlike LIFT, these thermal tapes are typically designed to work well for broad area release where an entire region is brought up to a temperature at which the tape's adhesive strength is significantly reduced. Once the adhesive strength is reduced, components can be transferred from donor to receiver substrate.

Current methodologies are limited to either spot release, as in laser-based systems, or wide area release, as in most thermal release tape applications.

BRIEF SUMMARY

In general, an approach for separating a selected component from a plurality of components in a multi-component medium is provided. A multi-component medium is created, including thermally conductive layer into which a template of patterned thermally conductive elements that are thermally separated from each other, a thermally active adhesion layer in thermal communication with the thermally conductive template, and a set of components attached to the thermally active adhesion layer in substantially the same pattern as thermally conductive template. The medium allows a selected component to be released by applying energy to a selected thermally conductive element corresponding to the selected component, reducing the adhesion of the thermally active adhesion layer, without releasing non-selected components.

One aspect of the present invention includes a method for separating a selected component from a plurality of components on a multi-component medium. The method comprises choosing the selected component from the plurality of components on the multi-component medium, the multi-component medium having the plurality of components, a thermally active adhesion layer, and a thermally conductive layer, the thermally conductive layer being segmented into a template of patterned thermally conductive elements by a set of separations in the thermally conductive layer that thermally separate individual elements in the template of thermally conductive elements. The method further comprises releasing the selected component of the set of components by applying an energy source causing a temperature differential to a single element of the thermally conductive elements, wherein the applying of the source of temperature differential to the single element of the thermally conductive elements transmits the temperature differential to a portion of the thermally active adhesive corresponding to the single element, selectively releasing a component of the set of components corresponding to the portion of the thermally active adhesive.

Another aspect of the present invention includes a multi-component medium, comprising, a thermally conductive template having a plurality of patterned thermally conductive elements; a thermally active adhesion layer in thermal communication with the thermally conductive template; a set of components attached to the thermally active adhesion layer in substantially the same pattern as thermally conductive template; and a set of separators in the thermally conductive template that thermally separate each individual thermally conductive element from other thermally conductive elements in the thermally conductive template.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
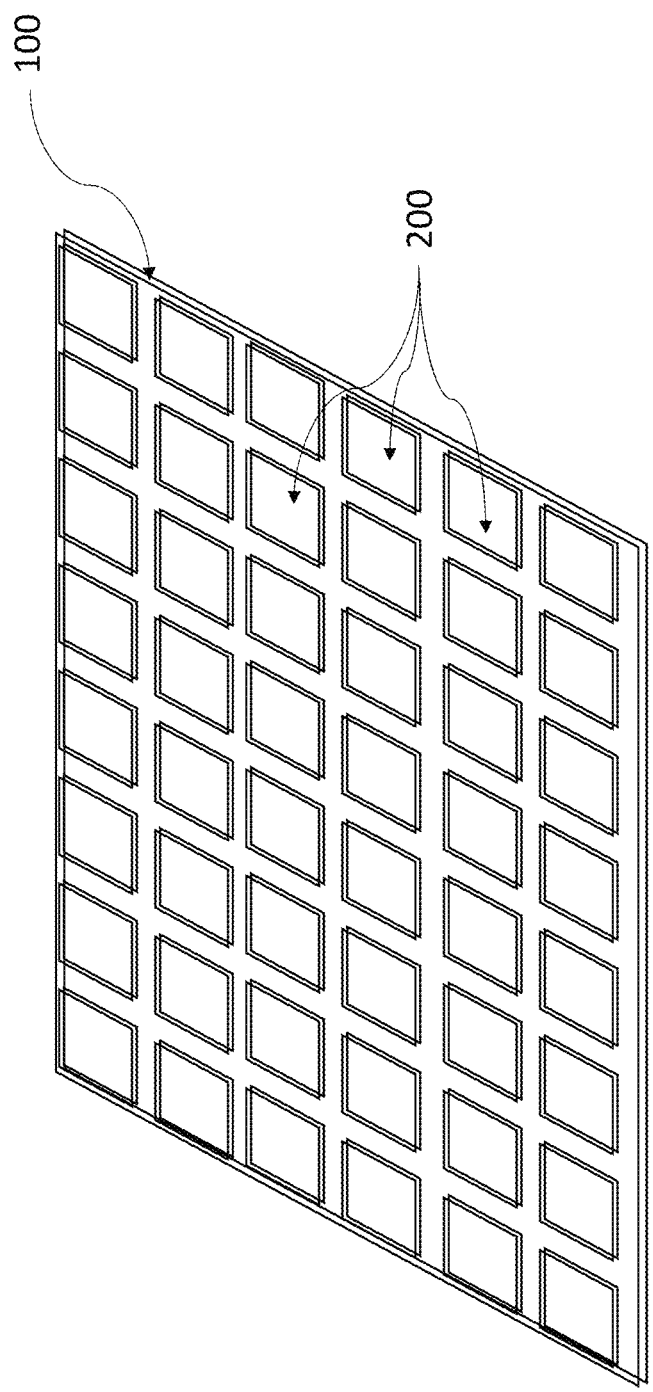
FIG. 1 depicts one embodiment where 100 represents a substrate upon which the thermally conductive elements 200, are affixed.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Furthermore, the terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. Furthermore, similar elements in different figures may be assigned similar element numbers. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless specifically stated otherwise, it may be appreciated that terms such as "processing", "detecting", "determining", "evaluating", "receiving", or the like, refer to the action and/or processes of a computer or computing system, or similar electronic data center device, that manipulates and/or transforms data represented as physical quantities (e.g., electronic) within the computing system's registers and/or memories into other data similarly represented as physical quantities within the computing system's memories, registers or other such information storage, transmission, or viewing devices. The embodiments are not limited in this context.

As stated above, embodiments of the present invention provide an approach for separating a selected component from a plurality of components in a multi-component medium. A multi-component medium is created, including thermally conductive layer into which a template of patterned thermally conductive elements that are thermally separated from each other, a thermally active adhesion layer in thermal communication with the thermally conductive template, and a set of components attached to the thermally active adhesion layer in substantially the same pattern as thermally conductive template. The medium allows a selected component to be released by applying energy to a selected thermally conductive element corresponding to the selected component, causing a temperature change reducing the adhesion of the thermally active adhesion layer, without releasing non-selected components.

To this extent, solutions disclosed herein include methods and materials that can utilize any energy source, including but not limited to convection, radiation, and conduction, along with a shaped thermally conductive region to customize the temperature profile in ways unattainable using prior conventional methodologies. This becomes particularly important in transferring single electronic components from donor to receiver substrates.

Heat spreaders have been used for thousands of years in metal cookware and other applications to get an even temperature distribution across a surface. Modern applications sometimes include use of them in thermal control of high-density electronics, control of temperature profiles in photovoltaic systems, and a myriad of other applications. Heat spreaders are typically based on materials that have high thermal conductivity and are used to reduce the peak temperature by spreading the heat across a broad area. Obviously, heat flows via conduction from high temperature to low temperature in these thermal spreading applications. Heat pipes and other more complicated systems can be used as well, depending on application, for thermal control. The fundamental properties of thermodynamics come into play and there are conductive, convective, and radiative energy transport mechanisms that all interact to create a time-dependent temperature profile across a surface.

On a microscopic level, conduction is the passing of vibrational energy in which a lattice of atoms or molecules will oscillate and transfer vibrational energy across a material. Physicists model this vibrational energy transfer in terms of phonon transport. Packets of vibrational energy are treated as discrete phonons in several models. Materials of lower inherent thermal conductivity can slow the propagation of vibrational energy (or phonons) across a region. Controlling the temperature profile on a nano or micro scale is difficult because lattice vibrational energy naturally flows from high temperature to low temperature on a molecular/atomic scale.

Thermal release tape is now commonly used in electronic manufacturing where the tape loses its adhesive strength upon reaching a threshold temperature. Tape manufacturers may use phase change materials, expanding materials, and the like to induce a dramatic change in the adhesive strength as the temperature of the thermally active adhesion layer increases over a threshold temperature. Electronic components are often stuck to the thermally active adhesion layer and upon heating, can be released from the thermally active adhesion layer. This typically happens in bulk, where a large area of the tape is heated and all the effected components are released at once. These tapes are available in rolls for all wafer mounting systems and hence thermal release tape is widely used in semiconductor package industry.

Controlling the size and geometry of the release area on the thermal tape is difficult and hence is not currently used in electronics manufacturing for releasing single, small components. Many applications could benefit from release of individual small electronic components, but controlling the release area requires precise geometric control of the temperature profile, as disclosed herein.

Laser induced forward transfer (LIFT) is a widely used direct transfer technique used in printing, electronics, biotechnology industries, and others. Lasers with relatively low fluence are used for more sensitive materials like organics or biological materials. A spot-focused laser is typically used in LIFT applications that defines the resolution of the final transfer as well. Typically, a pulsed laser beam is used and the energy of the beam is the driving force that propels material from donor surface to acceptor. This is a robust method that is compatible with a variety of materials both solid and liquid. Inks of variable viscosities and particle sizes are compatible with the LIFT methodology. In addition, solid materials such as electronic components can be transferred from donor to acceptor surfaces. Companies like Uniqarta, Nitto, Philips, and others are developing dynamic release layers (DRL) that will propel individual components from donor to acceptor, typically based on a rapidly expanding thermally active adhesion layer when laser light is applied.

DRL layers are designed to absorb the laser wavelength light and then propel the materials to the acceptor substrate. The accuracy and transfer efficiency is often controlled by the dynamics of the DRL. Researchers are still trying to develop transfer systems including new types of DRLs that improve positioning for micro and mini sized electronic components. Often these transfer mechanisms have to be very reliable and very accurate, within 10 μm of the final location upon transfer to the acceptor substrate. Current methodologies and materials fall short of the accuracy and transfer efficiency goals for the electronics industry.

The shortcomings of the prior art are overcome and additional advantages are provided through the provisions, in one aspect, a method that includes, for instance: using shaped thermally conductive materials such as pyrolytic graphite or other good conductor materials that define the release area for the electronic component and subsequently alter temperature with a laser to release it from thermal release tape.

Generally stated, disclosed herein are methods and systems for releasing a component of a set of components. FIG. 1 illustrates an example of a substrate 100 and a set of patterned thermally conductive elements 200 in thermal communication with the substrate 100. Thermally conductive elements 200 may be provided in a template defining the shape and area of the thermally conductive elements 200. Note that the individual thermally conductive elements 200 are physically separated from each other to ensure that thermal conductivity, or the spreading of a thermal differential, including but not limited to heating or cooling, from a source, only occurs on individual elements, without conducting to adjacent elements. This concept applies generally to all embodiments described herein, allowing for site specific heat transference, and thus allowing for the individual release of devices. The shape and spacing of thermally conductive elements 200 are not meant to be limiting, as any array of shapes may be used depending on the end application.

Figure 2:
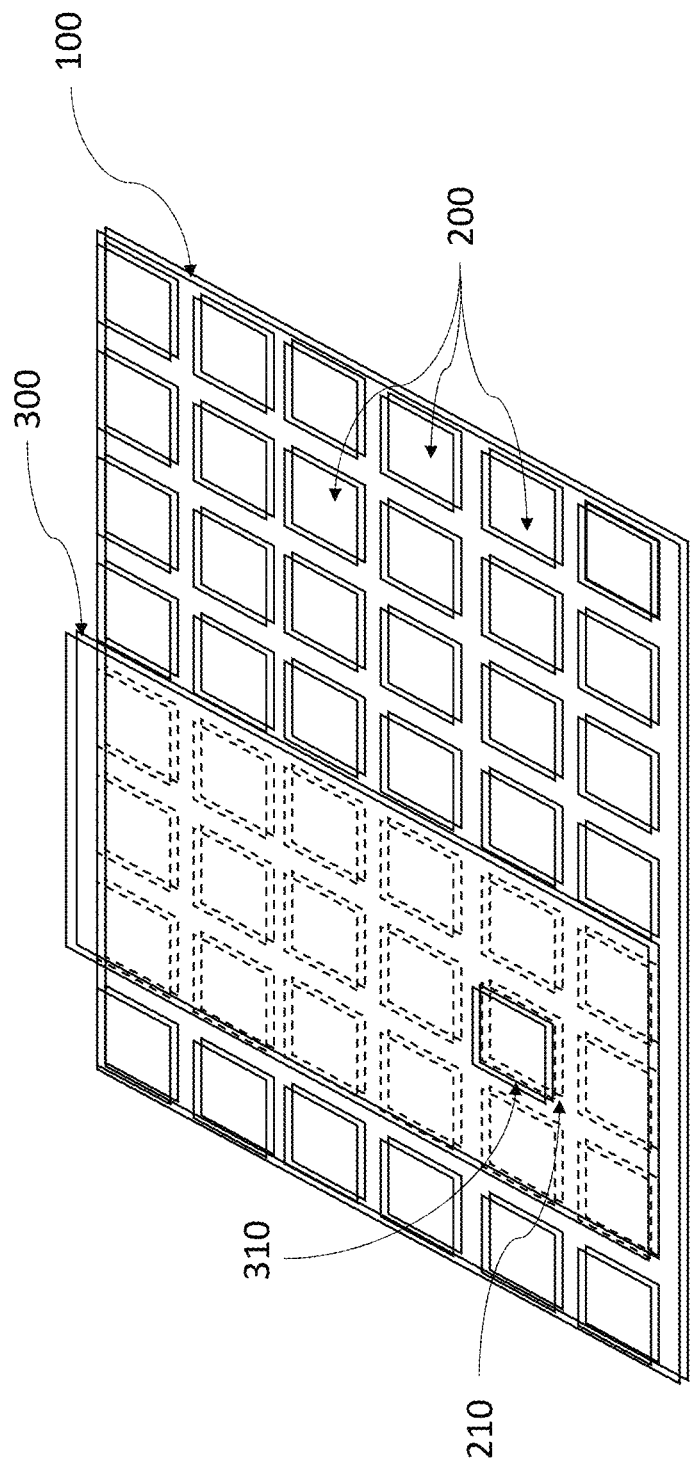
FIG. 2 depicts the substrate 100 and thermally conductive elements 200 from FIG. 1 with the addition of a thermally active adhesion layer, 300.

FIG. 2 illustrates, in one embodiment, the addition of a thermally active adhesion layer 300 in thermal communication a thermally conductive layer. This thermally conductive layer has been patterned to form a thermally conductive template that has a plurality of conductive elements 200, with each thermally conductive element 200 being thermally separated from some or all other thermally conductive elements by a set of separators. In embodiments using multiple thermally conductive elements 200, the thermally conductive elements 200 may be physically separated. For instance, the thermally conductive material may be etched to ensure that there are gaps between each element. Alternatively, thermally conductive material may be placed physically onto a surface and manually inspected to ensure separation. Thermally active adhesion layer 300 is an interface between the thermally conductive template formed by thermally conductive elements 200 and the set of components that provides an attractive force between the conductive template and the components. In an embodiment, thermally active adhesion layer 300 may be comprised of a thermally active adhesive, such as a multi-layer tape. One example of a thermally active adhesive is the thermal release tapes produced by Nitto Denko Inc. REVALPHA product line, although it should be understood that a thermally active adhesive could include any adhesives known in the art or using any other solution now known or later discovered, including, but not limited to tape, resins, thin films, functional coatings, polymers such as PDMS and/or any other substance used for its ability to adhere. Alternatively, the attractive force in thermally active adhesion layer 300 can be attributed to forces of other types including, but not limited to, Van der Waals forces, electrostatic forces, magnetic forces, surface tension forces, tackiness, cohesion, which has an attractive force which can be altered when the temperature is altered.

In any case, the separators between conductive elements 200 allow a temperature differential to be applied to an individual element 210 of thermally conductive elements 200 (e.g., such that individual element is heated, cooled, or otherwise thermally altered), without thermally altering other thermally conductive elements 200 on the thermally conductive template. The result is a temperature differential affecting 310, which is the area of thermal active layer 300 that is impacted by the temperature change in 210. In one embodiment, a heat source, including but not limited to a laser, applied to area 210 of substrate 100, will activate only region 310 of thermally active adhesion layer 300 by virtue of the individual thermally conductive element 210, without affecting other thermally conductive elements 200, and thus other regions of thermally active adhesion layer 300.

In the case that heat is applied to the substrate 100, as long as the heat is applied in a single region of the substrate, a particular thermally conductive element 210 can spread the heat across a single portion 310 of the thermally active adhesion layer, allowing for the removal of a single area of interest. In some embodiments, while the term "heat" may be used, it is intended to include any thermal differential. For instance, heating, cooling, temperature gradients, or fluxes may all be utilized to activate the thermally active adhesion layer. Additionally, the thermal differentiation may actually spread beyond the single portion 310, activating multiple areas at once, but only within a threshold. Where the threshold for release is not met, the thermally active adhesion layer will not be activated to release the respective element. Alternatively, the thermal differentiation may not need to spread across the entire area or volume of the single portion 310 of the thermally active adhesion layer in order to reach a threshold for releasing the respective element.

Figure 3:
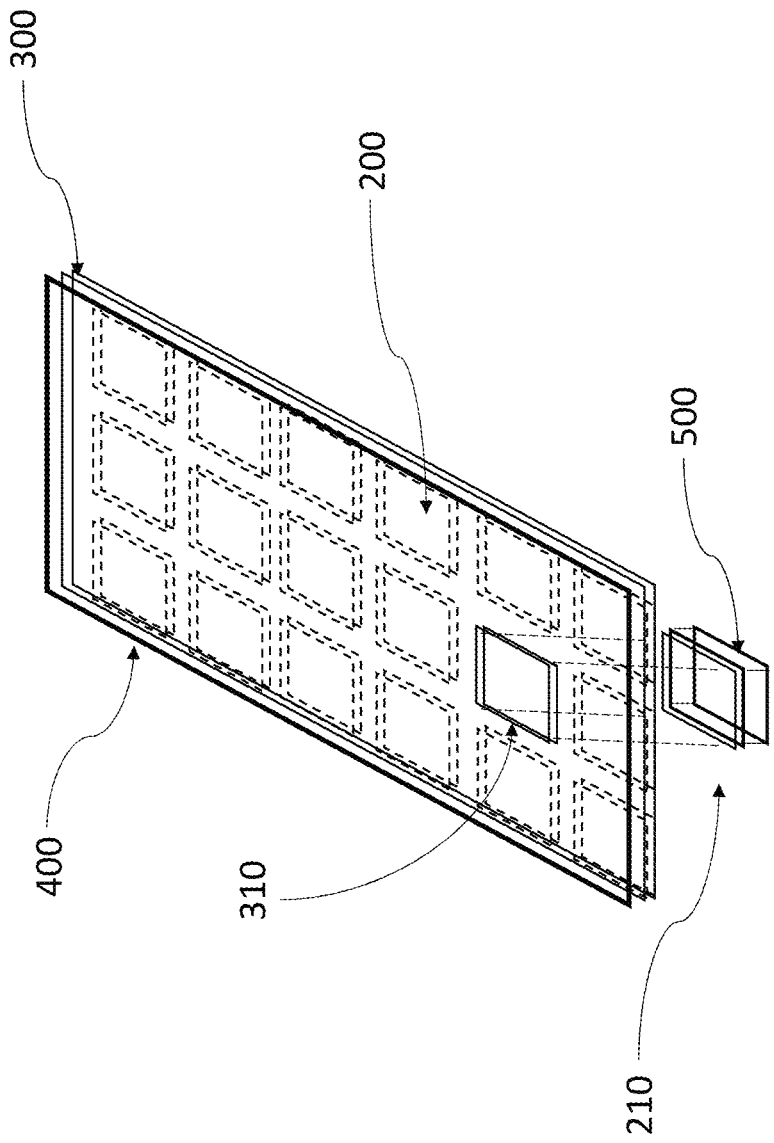
FIG. 3 shows one embodiment of the invention, wherein an individual component 500 is released from the substrate along with the thermally conductive element 210 affixed to component 500.

For instance, as depicted in FIG. 3, component 500 of a set of components is released without affecting any other components in the vicinity of other patterned thermally conductive elements. Component 500 can include any nano or micro scale electronic device for which binning, sorting, testing, or placing may be necessary including, but not limited to LEDs, micro LEDs, mini LEDS, photovoltaic devices, concentrator photovoltaic devices, transistors, capacitors, inductors, diodes, resistors, thermoelectrics, and a myriad of other microelectronic devices. Whatever the case, the release may be performed by methods such as, including but not limited to, gravity alone, such that the force of gravity is stronger than the remaining force of the thermally active adhesion layer, and/or external forces e.g. vibrational, adhesion (via tape, elastomer stamp, static electricity, etc.), or magnetic forces that are applied to assist in the removal of the component 500.

Figure 4:
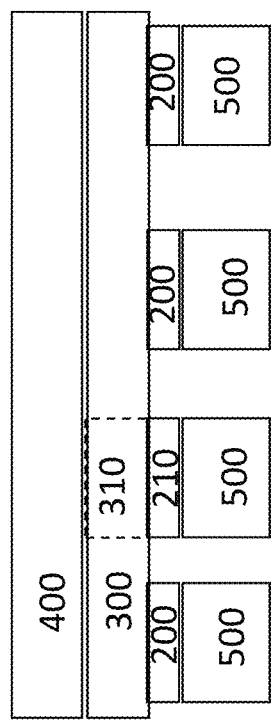
FIG. 4 illustrates an additional side view of the embodiment of FIG. 3.

FIG. 4 illustrates a side view of embodiments in this arrangement, wherein the thermally conductive element is released with the component. For instance, a substrate 400, not unlike substrate 100 of FIG. 1, may have a thermally active adhesion layer 300 applied thereon. The plurality of thermally conductive elements 200 are affixed to the thermally active adhesion layer 300, and permanently affixed to components 500, such that when heat is applied to a particular component 500 in the vicinity of thermally conductive element 210, the individual component 500 is released due to the spread of heat to region 310 of thermally active adhesion layer 300, causing the release by thermal application.

Many configurations are possible and this is just one embodiment, wherein having the thermally conductive element 210 still attached to the component 500 may be useful. This embodiment is not meant to be limiting. It is to be understood that while a single element 500 is illustrated, multiple elements 500 may be released either simultaneously or sequentially by targeting multiple thermally conductive elements 200.

For instance, while only a single component is illustrated as being released, a plurality of predetermined components may be released simultaneously using multiple heat sources, or rapidly using a moving heat source. In some embodiments, especially wherein removal is assisted with vibrational or magnetic forces, a plurality of components may be selected, for instance, based on properties shared across some of the components, and all released together after applying heat source to each individual component desired to be removed.

Figure 5:
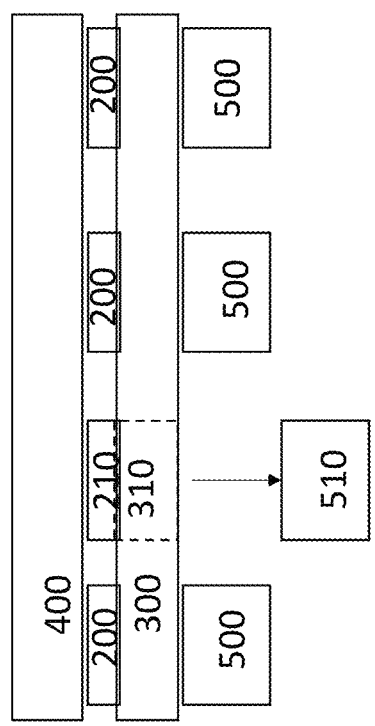
FIG. 5 illustrates an embodiment wherein the component 510 is attached directly to the thermally active adhesion layer 300, with the thermally conductive element being permanently affixed to the substrate and having an thermally active adhesion layer on the opposite surface, such that only the component 510 is released.

FIG. 5 illustrates another embodiment wherein the thermally conductive element is in thermal communication with the substrate 400 and the thermally active adhesion layer 300 is in thermal communication with the thermally conductive elements 200, and the set of components 500 are attached to the thermally active adhesion layer 300. In such an embodiment, the components 500 are separated from the thermally conductive elements 200 and released independently. Thus, the individual component 510 can be released directly without other material connected thereon. As before, the component 510 may be released due to gravitational force alone if that force is greater than the residual adhesive force of thermally active adhesion layer 300 at region 310 following the heat activated features. Alternatively, component 510 can be removed using a tape, stamp, static electricity, or other attractive forces that are stronger than the residual adhesive strength on the thermal release tape. This tape, stamp, etc. may be placed proximate to or in contact with components 500 before, during, or after application of the heat source to collect released components 500. Static, magnetic, diamagnetic, vibrational, ultrasonic, gravitational, or similar forces may collect released components, as well as direct contact. As in previous embodiments, a plurality of components 500 may be released using a single, moving heat source, or a plurality of heat sources.

In one exemplary embodiment, a thermal differential is applied to substrate 400, e.g., via a laser. The thermal differential is conducted throughout substrate 400 to thermally conductive components 200 strongest in the vicinity of applied thermal differentiation. Thermally conductive element 210, for instance, conducts the thermal differentiation to thermally active adhesion layer 300, strongest at region 310. Barriers (e.g., separators), for instance gaps between thermal conductive elements 200, limit the conductivity of thermal differentiation. Upon exceeding a threshold of thermal differentiation large enough to delaminate or release thermally active adhesion layer 300 at region 310, individual component 510 is released. In some embodiments, adhesion force to individual component 510 is reduced such that gravity alone will remove component 510, but in some embodiments an external force stronger than the remaining adhesion will allow for component 510 to release.

It should be understood that thermally conductive elements 200 in all embodiments can include but are not limited to pyrolytic graphite (PG), graphene, mica, and many other stratified or layered materials which have axial and radial conduction properties that are anisotropic. These materials have advantages because the desired outcome is to have heat spread uniformly across the confines of the thermally conductive material that is used to define the shape of the component to be released. However, other materials may also be used as a thermally conductive element, including but not limited to strong conductors such as metals, semiconductors, composites, alloys, and laminate materials. Graphene, for example, has very good lateral conductivity and when laminated with metals or metal composites that are typically good isotropic conductors, the resultant thermally conductive region will have desirable properties according to embodiments of the invention disclosed herein.

Additionally, as weight reduces with small components 500, gravitational force alone may not be strong enough to release components from the adhesive region 310. As such, external forces such as vibration, ultrasonic, magnetic induced repulsion or attraction, adhesion from tapes, stamps, or static electricity or other methods can be used to release the component from the residual thermally active adhesion layer.

Figure 6:
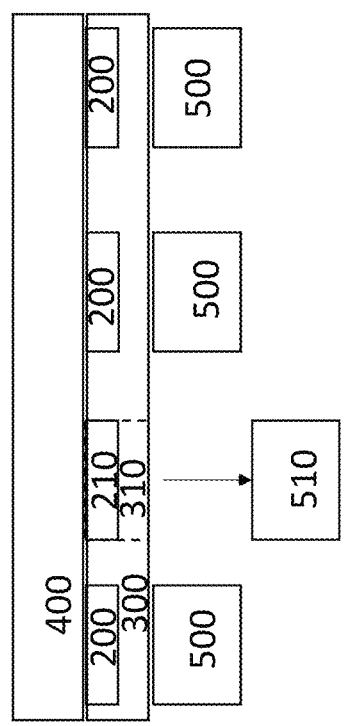
FIG. 6 illustrates an embodiment wherein the thermally conductive elements 200 are incorporated into the thermally active adhesion layer 300.

FIG. 6 shows another embodiment where the thermally conductive elements are incorporated into thermal release tape directly. In this embodiment, thermally conductive elements 200 are incorporated into the tape itself. When element 210 is heated, the temperature spreads across the surface. This will change the adhesive strength in region 310 of the broader thermal release layer 300.

Figure 7A:
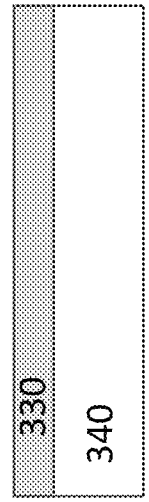
FIGS. 7A-B illustrate side views of single and double sided thermally active adhesion layer 300.
Figure 7B:
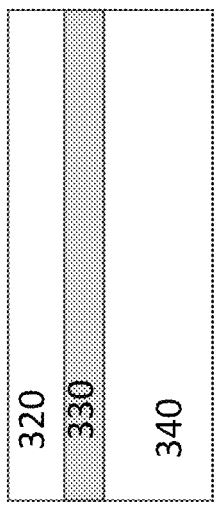

FIGS. 7A-B illustrate a more detailed view of thermally active adhesion layer 300. For instance, FIG. 7A illustrates a double sided thermally active adhesion layer 300 including a pressure sensitive thermally active adhesion layer 320, a backing layer 330, and a thermal release adhesive 340. In this embodiment, pressure sensitive adhesive 320 is applied to the thermally conductive element 200 or substrate 400, allowing component 500 to be released upon activation of the thermal release adhesive 340 losing adhesion properties. In FIG. 7B, a single sided thermally active adhesion layer 300 is illustrated, having only backing layer 330 and thermal release adhesive 340.

In some embodiments, a single type of component 500 may be included. In alternative embodiments, a mixture of component types 500 can be utilized, afforded by the methods disclosed herein, via release of particular components desired or the release of non-contiguous LEDs, for example, from a wafer. A combination of macro and micro components may be utilized due to the strict control afforded.

Methods and systems disclosed herein may be compatible with laser dicing, dicing saw application, stealth dicing, etc. It is important that the components on the native substrate must have a gap between them to accommodate dropping. In an embodiment, the material forming the thermally conductive elements is etched (e.g., via laser, oxygen plasma, etc.) using a mask to ensure that there are gaps between each thermally conductive element. In other embodiments, thermally conductive material could be physically placed (e.g., deposited) onto a surface and the surface inspected to be sure the thermally conductive elements corresponding to individual components are not in contact with one another. Typically, stealth diced components have the smallest kerf spacing between the components and this can be enlarged via stretching on a hoop, as should be understood to one of ordinary skill in the art. Other dicing techniques like laser ablation can also be used to singulate the components on the wafer and this dicing technique also results in a gap between the individual components.

It is apparent that there has been provided herein a multi-component medium and approaches for separating a selected component from a plurality of components on a multi-component medium. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A method for releasing a selected component from a plurality components on a multi-component medium, the method comprising:
choosing the selected component from the plurality of components on the multi-component medium, the multicomponent medium having the plurality of components, a thermally active adhesion layer, and a thermally conductive layer, the thermally conductive layer being segmented into a template of patterned thermally conductive elements by a set of separations in the thermally conductive layer that thermally separate individual elements in the template of thermally conductive elements; and
releasing the selected component of the set of components by applying a source of temperature differential to a single element of the thermally conductive elements, wherein the applying of the source of temperature differential to the single element of the thermally conductive elements transmits the temperature differential to a portion of the thermally active adhesive corresponding to the single element, selectively releasing a component of the set of components corresponding to the portion of the thermally active adhesive.

2. The method of claim 1, wherein the source of temperature differential is applied to a substrate and the set of patterned thermally conductive elements is designed to spread the temperature differential over the component of the set of components, allowing the thermally active adhesion layer to release the component.

3. The method of claim 2, wherein the component includes the thermally conductive element when released.

4. The method of claim 1, wherein the thermally active adhesion layer is coupled to the set of components on a first side and to the set of patterned thermally conductive elements on a second side, the set of patterned thermally conductive elements being attached to the set of components.

5. The method of claim 4, wherein the component is substantially free of any other material when released.

6. The method of claim 1, wherein the temperature differential source includes a conductive, convective, or radiative based heat source.

7. The method of claim 1, wherein the thermally active adhesion layer is coupled to a substrate on a first side and the set of patterned thermally conductive elements on a second side, the patterned thermally conductive elements being attached to the substrate.

* * * * *